(12) United States Patent
Qiang et al.

(10) Patent No.: US 7,115,439 B2
(45) Date of Patent: Oct. 3, 2006

(54) HIGH PHOTOSENSITIVITY CMOS IMAGE SENSOR PIXEL ARCHITECTURE

(75) Inventors: Luo Qiang, Santa Clara, CA (US); Phan Christina, San Jose, CA (US); Kindt J. Willem, Sunnyvale, CA (US)

(73) Assignee: Eastman Kodak Company, Rochester, NY (US)

( * ) Notice: Subject to any disclaimer, the term of this patent is extended or adjusted under 35 U.S.C. 154(b) by 108 days.

(21) Appl. No.: 10/759,899

(22) Filed: Jan. 16, 2004

(65) Prior Publication Data
US 2005/0156206 A1 Jul. 21, 2005

(51) Int. Cl.
*H01L 21/00* (2006.01)
(52) U.S. Cl. .......................... 438/59; 438/237
(58) Field of Classification Search ............. 438/59, 438/237
See application file for complete search history.

(56) References Cited

U.S. PATENT DOCUMENTS

| 4,831,430 | A | 5/1989 | Umeji |
| 5,252,851 | A | 10/1993 | Mita et al. |
| 6,586,789 | B1 * | 7/2003 | Zhao .................. 257/292 |
| 2002/0162945 | A1 * | 11/2002 | Chen et al. .......... 250/214.1 |

FOREIGN PATENT DOCUMENTS
EP  0 576 009 A1  12/1993
JP  63-215084  9/1988

OTHER PUBLICATIONS

Shou-Gwo et al.; *A High Performance Active Pixel Sensor with 0.18 µm CMOS Color Imager Technology*; 2001 IEEE; pp. 24.3.1-30.4.3.
Bart Dierickx et al.; *Near-100% Fill Factor Standard CMOS Active Pixel*; 4 pages, no date.
Carlos R. Jorquera et al., *Design of New Photodiode Standards for Use in the MISR In-Flight Calibrator*, Jet Propulsion Laboratory, California Institute of Technology, IEEE, 1994, pp. 1998-2000.

* cited by examiner

*Primary Examiner*—Chandra Chaudhari
(74) *Attorney, Agent, or Firm*—Peyton C. Watkins

(57) ABSTRACT

The photosensitive volume of a pixel is extended beyond the photodiode region, which allows the pixel sensitivity to be relatively independent of the photodiode region. In an example embodiment, the photosensitive volume can be maximized by using a CMOS process to remove heavily doped material (e.g., as from in a P well) from the photodiode and to form a pn junction on lightly doped material (e.g., p-type epitaxial layer). The photosensitive volume is thus defined by the larger area of the lightly doped material rather than being merely restricted to the photodiode region. Based on the requirements of signal-to-noise ratios (SNR) and desired dynamic range (DR), a minimized size photodiode (with optimized area and perimeter) can be designed to maximize photo conversion gain, which maximizes sensitivity.

17 Claims, 4 Drawing Sheets

HIGH PHOTOSENSITIVITY CMOS IMAGE SENSOR PIXEL ARCHITECTURE

FIELD OF THE INVENTION

The present invention relates generally to CMOS image sensors, and more particularly to CMOS image sensor pixel architecture.

BACKGROUND OF THE INVENTION

Electronic image sensors are widely used to produce video and photographic images. The electronic image sensors typically comprise pixel sensors that are arranged in an array of rows and columns. The photosensitive volume of conventional CMOS image sensor pixels is limited to a photodiode area such that the pixel photosensitivity is limited by either the photodiode region or the associated photo conversion gain. The pixel sensitivity reaches a saturation level as the photodiode area keeps increasing. Accordingly, there is a need to improve the sensitivity of conventional pixels.

An appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
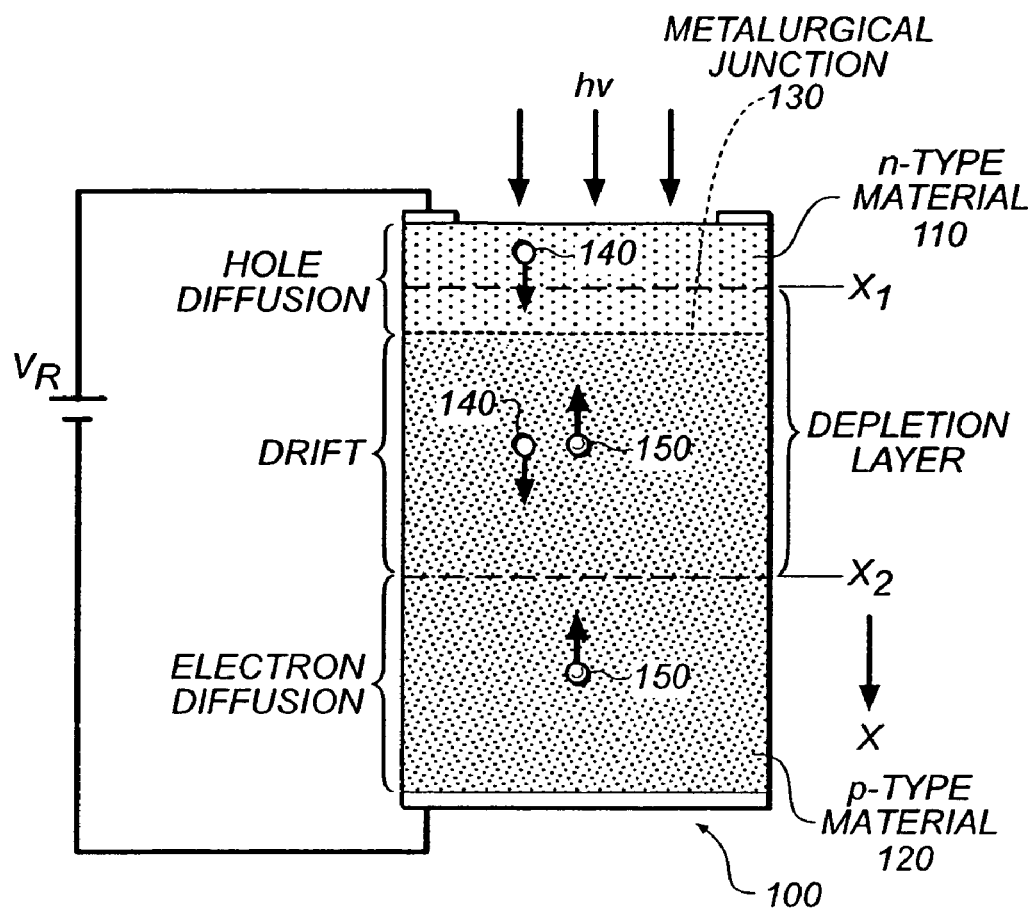
FIG. 1 is a schematic diagram of a pn-junction photodiode having a photo-generated charge transport mechanism used in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed towards a highly photosensitive CMOS image sensor pixel architecture. The photosensitive volume of a pixel in accordance with the present invention is extended beyond the photodiode region, which allows the pixel sensitivity to be relatively independent of the photodiode region. In an example embodiment, the photosensitive volume can be maximized by using a CMOS process to remove heavily doped material (e.g., as from in a P well) from the photodiode and to form a pn junction on lightly doped material (e.g., p-type epitaxial layer). The photosensitive volume is thus defined by the larger area of the lightly doped material rather than being merely restricted to the photodiode region. Based on the requirements of signal-to-noise ratios (SNR) and desired dynamic range (DR), a minimized size photodiode (with optimized area and perimeter) can be designed to maximize photo conversion gain, which maximizes sensitivity.

FIG. 1 is a schematic diagram of a pn-junction photodiode having a photo-generated charge transport mechanism used in accordance with the present invention. Photodiode 100 comprises n-type material 110 and p-type material 120, which forms metallurgical junction 130 at the interface between n-type material 110 and p-type material 120.

Accordingly, a diffusion current exists around metallurgical junction 130, in which majority carriers (comprising "holes" 140 and electrons 150) move from areas of higher concentration to areas of lower concentration. The diffusion of carriers forms a depletion region, which extends upwards and downwards from the metallurgical junction (130).

Voltage source $V_R$ is coupled to photodiode 100 to produce an electric field across the photodiode from n-type material 110 to p-type material 120, which increases the depth of the depletion layer. Photons impinging the depletion layer causes charge carriers (electrons and "holes") to be formed. The electric field separates and sweeps the charge carriers across the junction in accordance with the bias such that a drift current is produced.

Sensitivity (S) of CMOS image sensors is proportional to photosensitive area (A), photo conversion gain (g) and quantum efficiency (QE), as shown in equation (1):

$$S \propto A \cdot g \cdot QE \tag{1}$$

High sensitivity of the sensor helps increase the signal-to-noise ratio (SNR) of the sensor system, which is greatly desired for imaging in dim environments (including, for example, automotive applications). High sensitivity of the sensor can be achieved by optimizing its photosensitive area, photo conversion gain and quantum efficiency.

The photosensitive area (A) is usually the area of photodiode ($A_d$). The "fill factor" of a photodiode is the ratio of the photodiode area to the pixel area.

Quantum efficiency (QE), which is defined as the ratio of collected charge pairs to absorbed photons, is a function of wavelength and depletion region depth. It is represented by $$QE(\lambda) = e^{-\alpha(\lambda)x_1} - e^{-\alpha(\lambda)x_2} \tag{2}$$

where α is the absorption coefficient of photo flux, λ is the wavelength of the photons, and $x_1$ and $x_2$ define the vertical depletion region boundary as shown in FIG. 1. Accordingly, the product of photosensitive area and quantum efficiency defines the photosensitive volume of the pixel.

Photo conversion gain is a function of the total capacitance C (including photodiode capacitance and parasitic capacitance) at the photodiode cathode and is described by $$g = \frac{q}{C(A_d)} \qquad (3)$$

where C is proportional to photodiode area $A_d$.

Usually the QE is fixed when the device features and the reverse bias are predetermined. An increased photodiode area (which results in an increase in the fill factor) increases sensitivity. However, when the major contribution of the total capacitance comes from the area capacitance, sensitivity will no longer increase by increasing the photodiode area alone.

Figure 2:
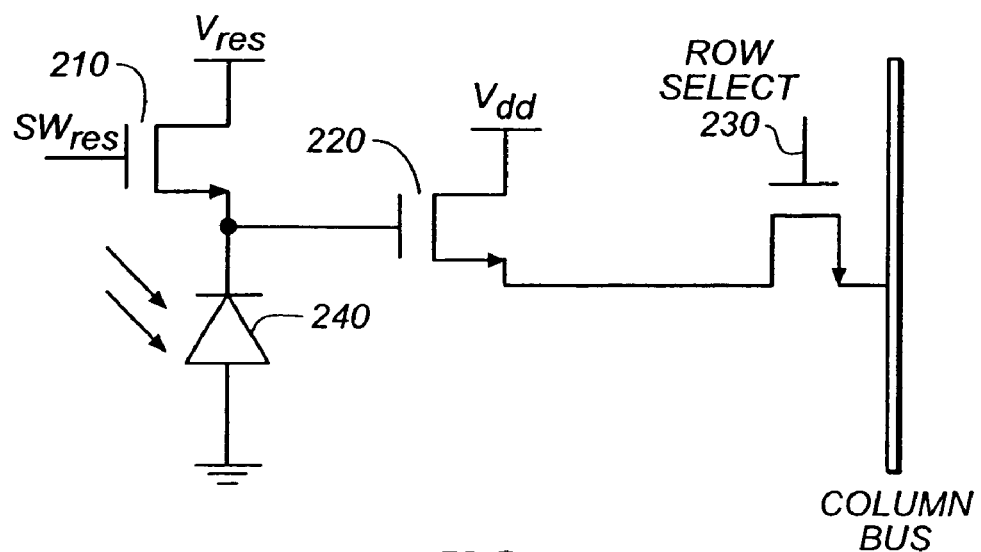
FIG. 2 is a schematic diagram of a three-transistor active pixel sensor in accordance with the present invention.

FIG. 2 is a schematic diagram of a three-transistor active pixel sensor in accordance with the present invention. In operation, $SW_{res}$ provides the reset pulse to reset transistor 210 to set the initial potential of the photodiode 240. The photodiode cathode is coupled to a source-follower transistor 220 to produce a buffered output signal at the source of transistor 220. The buffered signal is coupled to a column bus (of a pixel array) through select transistor 230 that is controlled by a row select pulse.

The photodiode is typically reset first to an initial level (e.g., $V_{res}$) by pulsing $SW_{res}$ high. At the falling edge of the $SW_{res}$ pulse, reset transistor 210 is turned off. The incident light-generated current then starts to discharge the photodiode. After certain time interval, the photodiode voltage of photodiode 240 is read out by pulsing the row select signal high. Next, photodiode 240 is reset again and the initial photodiode voltage is also read out. The difference between these two readout voltages can be used to determine the voltage drop caused by the incident light during that certain time interval.

Figure 3A:
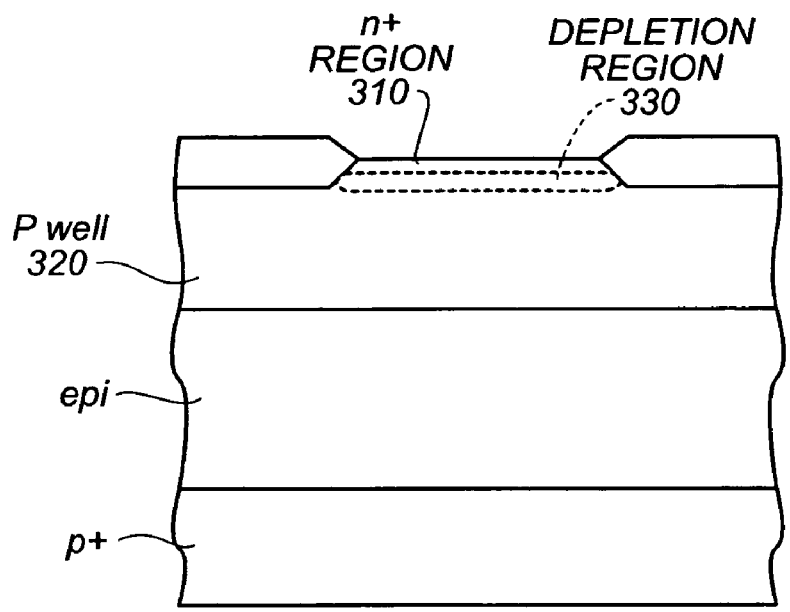
FIG. 3 is a schematic diagram of a cross section of a conventional n+ and an N well photodiode structure having a corresponding depletion region.
Figure 3B:
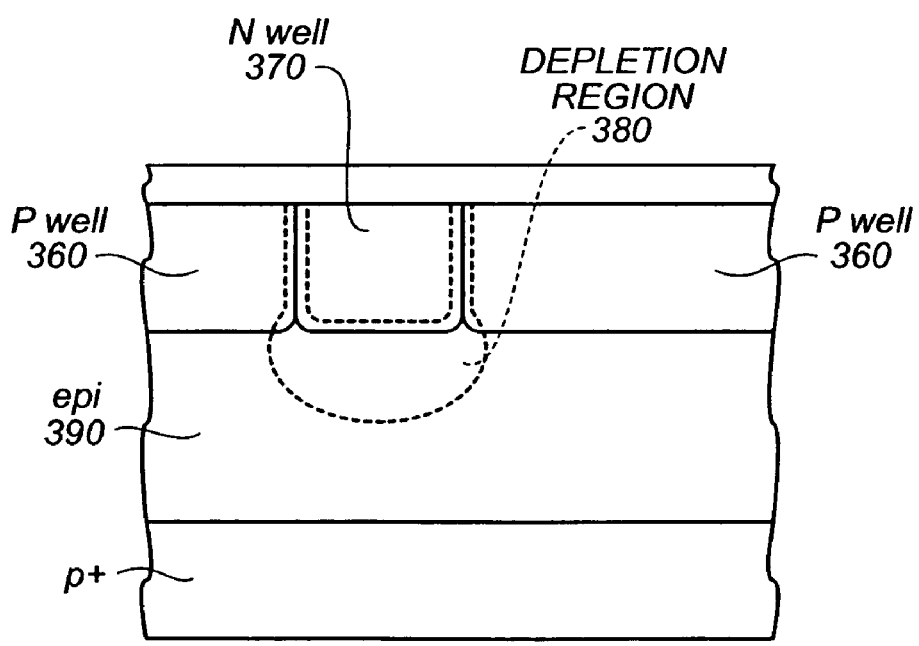

Typical advanced CMOS processes use a twin-well (P well and N well) process. A cross section of a conventional n+ and an N Well photodiode structure having a corresponding depletion region are shown in FIG. 3. In FIG. 3a, P well 320 surrounds n+ region 310, with a depletion region 330 being formed in the area surrounding the interface between n+ region 310 and P well 320. In FIG. 3b, P well 360 surrounds N well 370 sides and p− epitaxial layer 390 underlies P well 360 and N well 370. A depletion region 380 is formed in the area surrounding the interface between P wells 360 and N well 370. In addition depletion region 380 extends through an area surrounding the interface between the underlying (typically p− type) epi region (390) and the overlying N well (370).

A set of typical dopant concentrations of different layers for the structures of FIG. 3 is given in Table 1.

TABLE 1

| | n+ | nwell/pwell | p− epi | p+ sub |
|---|---|---|---|---|
| atoms/cm$^3$ | $1e^{20}$ | $2e^{17}$ | $5e^{14}$ | $1e^{18}$ |

The depletion region width of the structures can be estimated based on the dopant concentration and the reverse bias voltage (assumed to be 3.3V). The estimated depletion region widths are listed in Table 2.

TABLE 2

| Junction type | Depletion region width (μm) |
|---|---|
| n+/Pwell | 0.24 |
| Nwell/Pwell | 0.24 |
| n+/p− epi | 3.28 |
| Nwell/p− epi | 4.02 |

In conventional designs (as shown in FIG. 3), the photosensitive volume is relatively small compared to the volume required by the total pixel. Typically, only the area of the photodiode and the close region around it are light sensitive.

Figure 4A:
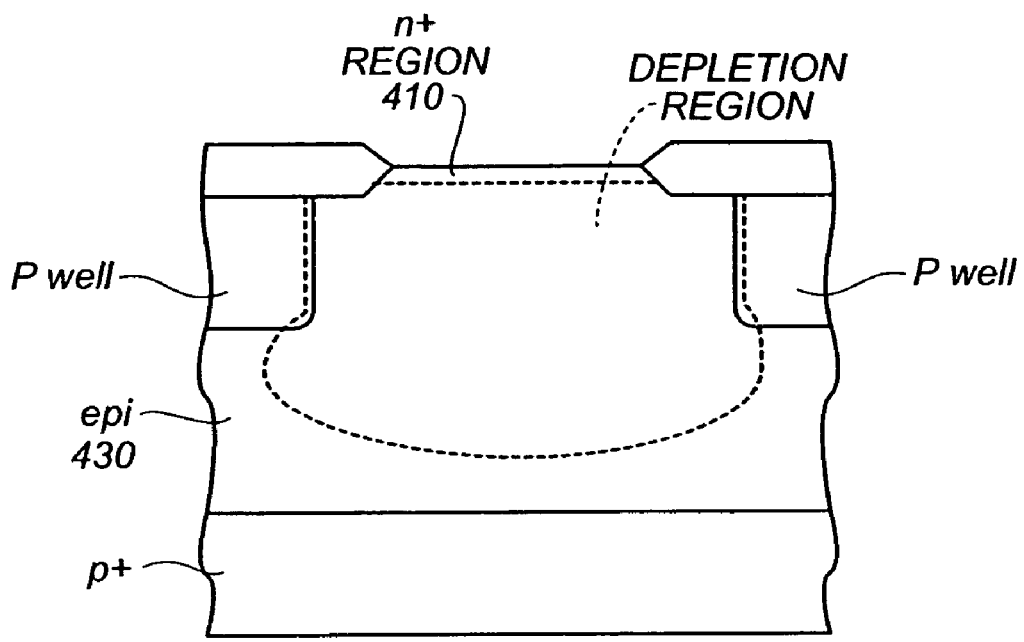
FIG. 4 is a schematic diagram of a cross section of an n+ and N well photodiode structure having a corresponding depletion region, in accordance with the present invention.
Figure 4B:
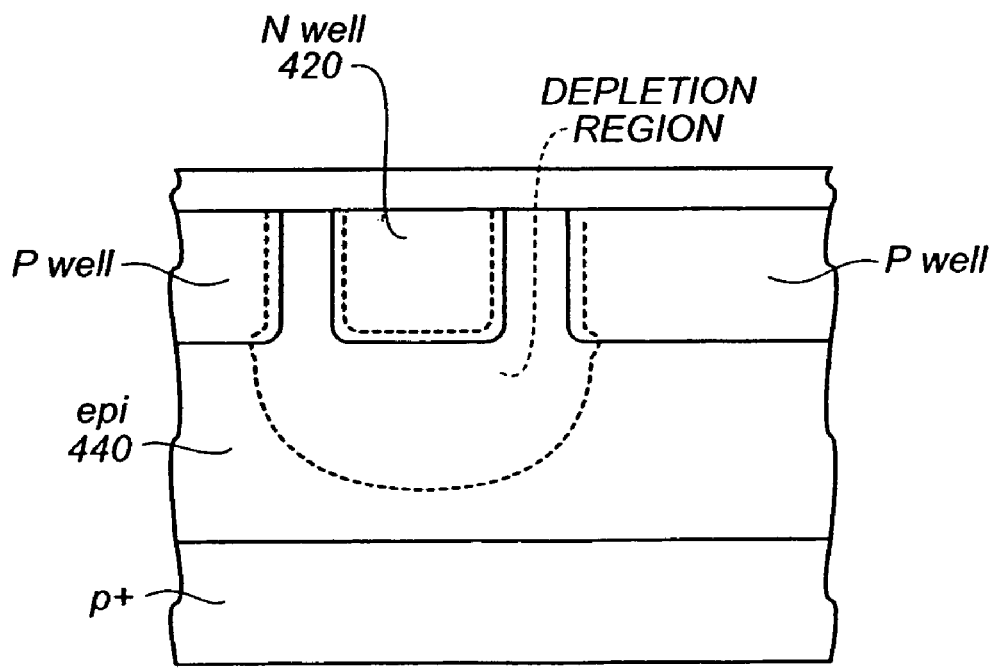

FIG. 4 is a schematic diagram of a cross section of an n+ and N well photodiode structure having a corresponding depletion region, in accordance with the present invention. As shown in the figure, heavily doped P well material can be removed or displaced such that a diode electrode structure such as n+ material 410 (FIG. 4a) or N well 420 (FIG. 4b) are closely coupled to p− epitaxial layer 430 (FIG. 4a) or 440 (FIG. 4b). The close coupling of the material 410 (or N well 420) to intervening epitaxial material of p− epitaxial layer 430 (or 440) results in a much wider depletion region width and a correspondingly much higher photosensitive volume.

The n+ type pixel in accordance with the present invention typically has a depletion region that extends deep into the substrate, which dramatically increases its QE. The N well-type pixel in accordance with the present invention typically has a much wider depletion region, which also increases its QE. The extended epitaxial layer boundary under the field oxide typically defines the effective photosensitive area ($A_{eff}$), which is larger than photodiode area. Accordingly, the photosensitive volume is substantially increased and the photosensitive volume is defined by the region of the lightly doped material (instead of being defined by the photodiode region).

In addition to increasing the photosensitive volume, pixel sensitivity can be further increased by increasing the photo conversion gain. In a high photosensitive active pixel in accordance with the present invention, a 3 μm depletion region is typically formed within the epi layer using current advanced CMOS processes. Accordingly, for a small pixel size (e.g. 8 μm or smaller), the depletion region is typically so wide that most of the p− epitaxial region will be depleted.

The maximum photosensitive volume is reached when the entire pixel area (that is not covered by metal) is light sensitive. The fill factor is thus limited by the metallization on top of the pixel. Accordingly, the sensitivity is largely dependent on the photo conversion gain, which is inversely proportional to the total capacitance at the cathode of photodiode (as shown in equation (3)). Accordingly, a pixel with a minimized capacitance and a maximized photosensitive volume maximizes the sensitivity of the pixel, in accordance with the present invention.

A smaller photodiode cathode capacitance typically results in higher reset noise and a correspondingly lower SNR. It also typically causes a lower dynamic range (DR) due to charge injection on the smaller capacitance and the higher reset noise level. The minimum capacitance is usually determined by the specification requirements, such as the SNR and DR. Given the SNR and DR requirements, the minimum photodiode capacitance can be determined and the area and perimeter of the photodiode optimized as well such that the optimum pixel design with the maximized sensitivity can be achieved. The sensitivity in accordance with the present invention is described by $$S \propto A_{eff} \cdot QE_{optimized} \cdot \frac{q}{C_{minimized}} \quad (4)$$

In addition to the increase of drift current, electrons and holes have longer lifetimes in lightly doped material, which increases the contribution of diffusion current. The contribution of diffusion current also increases pixel sensitivity.

The pixel architecture in accordance with the present invention increases sensitivity in the whole range of visible light wavelength. A wider surface depletion region increases the blue light sensitivity. A deeper and wider depletion region helps increase green light sensitivity. A deeper depletion region and higher diffusion current helps increase red light and near infrared light sensitivity.

The increase in sensitivity of this new architecture pixel is not necessarily directly related to the decrease in photodiode capacitance. One reason is that the parasitic capacitance becomes increasingly more important as the size of the photodiode keeps shrinking. Another reason is that when photodiode is very small (e.g., close to the size of a dot photodiode), the depletion region also shrinks and the photosensitive volume may not be maximized.

Figure 5:
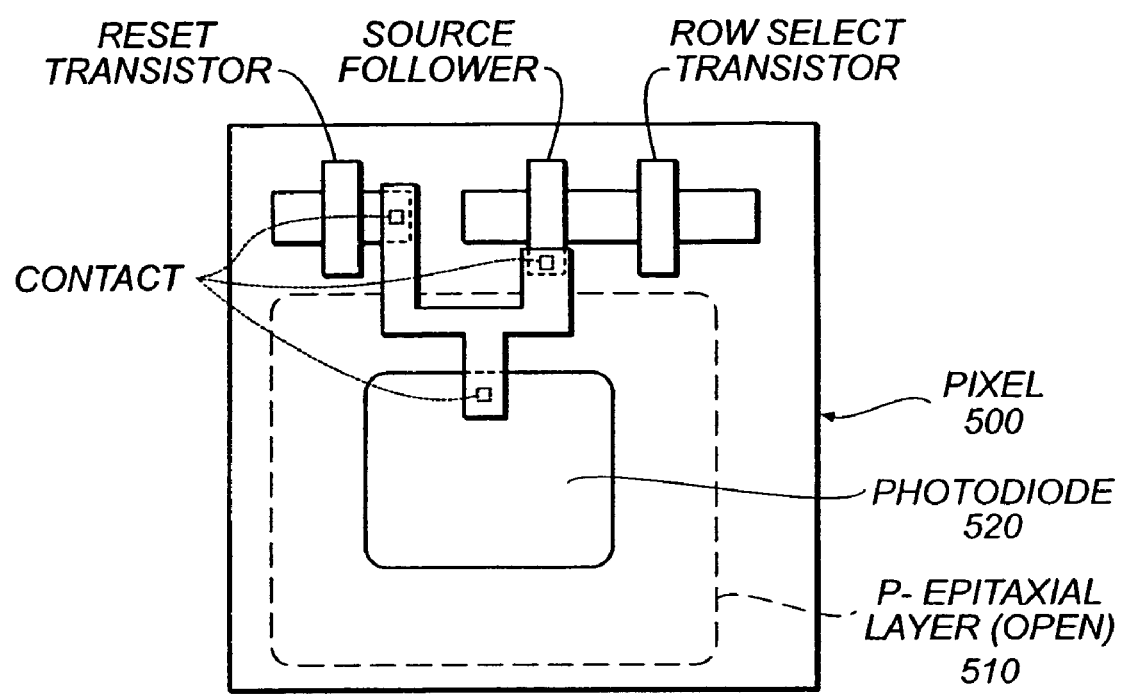
FIG. 5 is a schematic diagram of a top view of a highly photosensitive pixel layout architecture, in accordance with the present invention.

FIG. 5 is a schematic diagram of a top view of a highly photosensitive pixel layout architecture, in accordance with the present invention. As shown in the figure, photodiode 520 is shown as being formed within p− epitaxial layer (open) 510. P− epitaxial layer (open) 510 (including photodiode 520) is the photosensitive area of pixel 500. An example 7.5 um pixel in accordance with the present invention has an effective fill factor (defined by the ratio of effective photosensitive area to the pixel area) of 70.8% and an overall sensitivity of 15.5V/lux·s (without micro lens). Accordingly, the overall sensitivity of the pixel is 1.6 times higher than its conventional counterpart.

Various embodiments of the invention are possible without departing from the spirit and scope of the invention. The above specification, examples and data provide a complete description of the manufacture and use of the composition of the invention. For example, the P well on epitaxial layer 430 may be formed by electrically coupling separate P well structures. Since many embodiments of the invention can be made without departing from the spirit and scope of the invention, the invention resides in the claims hereinafter appended.

What is claimed is:

1. A method for highly sensitive imaging, comprising:
   providing a substrate;
   forming an epitaxial layer on the substrate;
   in the epitaxial layer, forming a first well extending from the surface of the epitaxial layer into the epitaxial layer and defined by one or more walls and a floor, wherein said floor is disposed in the epitaxial layer and spaced from the substrate said first well is of a first polarity type and
   wherein the first well is formed such that an intervening epitaxial material of the first polarity type exists between the floor and the adjacent walls of the first well; and
   forming a diode electrode structure of a second polarity type that is opposite the first polarity type wherein the diode electrode structure is one of an active diffusion layer of the second polarity formed on the intervening epitaxial material and a second well of the second polarity type formed within the intervening epitaxial material wherein the diode electrode structure is formed such that a first portion of the intervening epitaxial material is between the electrode structure and the first well and the relative doping concentration of the first and second wells are sized to generate a depletion region in the epitaxial layer extending laterally beneath the floor of the first well.

2. The method of claim 1, further comprising minimizing the capacitance of the diode electrode structure in accordance with the equation:

$$S \propto A_{eff} \cdot QE_{optimized} \cdot \frac{q}{C_{minimized}}$$

where S is the sensitivity of a pixel, $A_{eff}$ is the effective photosensitive area of the pixel, QE is the quantum efficiency of the pixel, q is the charge of an electron, and C is the capacitance of the diode structure.

3. The method of claim 1, further comprising applying a bias voltage across the first well and the diode electrode structure.

4. The method of claim 3, further comprising exposing a top surface of the intervening epitaxial material to light.

5. The method of claim 1, wherein the top surface of the intervening epitaxial material forms a continuous area surrounding the electrode structure.

6. The method of claim 1, wherein the intervening epitaxial material is contained within the first well.

7. The method of claim 1, wherein the epitaxial layer is formed on a P+ substrate.

8. The method of claim 1 wherein the heavily doped layer in the substrate is heavily doped with a first polarity type.

9. A method for highly sensitive imaging, comprising:
   providing a substrate doped with a layer heavily doped with a first polarity type;
   forming an epitaxial layer on the substrate lightly doped with said first polarity type;
   in the epitaxial layer, forming a first well extending from the surface of the epitaxial layer into the epitaxial layer and defined by one or more walls and a floor, wherein said floor is spaced from the heavily doped layer in the substrate said first well is more heavily doped with a first polarity type than the epitaxial layer such that an intervening epitaxial material of the first polarity type exists between the adjacent walls of the first well and separates the floor of the first well from the heavily doped layer in the substrate; and
   forming a diode electrode structure of a second polarity type that is opposite the first polarity type wherein the diode electrode structure is one of an active diffusion layer of the second polarity formed on the intervening epitaxial material and a second well of the second polarity type formed within the intervening epitaxial material wherein the diode electrode structure is formed such that a first portion of the intervening epitaxial material is between the electrode structure and the first well and a second portion of the intervening epitaxial material is between the second well and the heavily doped layer in the substrate.

10. The method of claim 9 wherein the heavily doped layer in the substrate is heavily doped with a first polarity type.

11. The method of claim 9, further comprising minimizing the capacitance of the diode electrode structure in accordance with the equation:

$$S \propto A_{eff} \cdot QE_{optimized} \cdot \frac{q}{C_{minimized}}$$

where S is the sensitivity of a pixel, $A_{eff}$ is the effective photosensitive area of the pixel, QE is the quantum efficiency of the pixel, q is the charge of an electron, and C is the capacitance of the diode structure.

12. The method of claim 9, further comprising applying a bias voltage across the first well and the diode electrode structure.

13. The method of claim 12, further comprising exposing a top surface of the intervening epitaxial material to light.

14. The method of claim 9, wherein the top surface of the intervening epitaxial material forms a continuous area surrounding the electrode structure.

15. The method of claim 9, wherein the intervening epitaxial material is contained within the first well.

16. The method of claim 9, wherein the epitaxial layer is formed on a P+ substrate.

17. A method for forming a highly sensitive vertical imaging structure, comprising:

providing a substrate with one surface heavily doped with a dopant of a first polarity to form one terminal of a vertical diode;

forming an epitaxial layer on the substrate, said epitaxial layer lightly doped with said first polarity type;

in the epitaxial layer, forming a first well extending from the surface of the epitaxial layer into the epitaxial layer and defined by one or more walls and a floor, wherein said floor is spaced from the heavily doped layer in the substrate said first well is more heavily doped with a first polarity type than the epitaxial layer such that an intervening epitaxial material of the first polarity type exists between the adjacent walls of the first well and separates the floor of the first well from the heavily doped layer in the substrate; and forming a second terminal of the vertical diode structure by forming in the surface of the epitaxial layer a region of a second polarity type that is opposite the first polarity type wherein the second well of the second polarity type formed within the intervening epitaxial material such that a first portion of the intervening epitaxial material is between the electrode structure and the first well and a second portion of the intervening epitaxial material is between the second well and the heavily doped layer in the substrate.

* * * * *

UNITED STATES PATENT AND TRADEMARK OFFICE
CERTIFICATE OF CORRECTION

PATENT NO.        : 7,115,439 B2                                               Page 1 of 1
APPLICATION NO. : 10/759899
DATED              : October 3, 2006
INVENTOR(S)      : Qiang Luo et al.

It is certified that error appears in the above-identified patent and that said Letters Patent is hereby corrected as shown below:

Title page item (75), (Inventors:)    Delete "Luo Qiang" and insert --Qiang Luo--.

Title page item (75), (Inventors:)    Delete "Phan Christina" and insert --Christina Phan--.

Title page item (75), (Inventors:)    Delete "Kindt J. Willem" and insert --Willem J. Kindt--.

Signed and Sealed this

Sixth Day of March, 2007

JON W. DUDAS
*Director of the United States Patent and Trademark Office*